United States Patent [19]
Kikuchi et al.

[11] Patent Number: 6,128,030
[45] Date of Patent: *Oct. 3, 2000

[54] SEMICONDUCTOR EXPOSURE DEVICE

[75] Inventors: Hiroki Kikuchi; Yushi Kaneda, both of Tokyo; Masato Hamatani, Saitama, all of Japan

[73] Assignees: Sony Corporation; Nikon Corporation, both of Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/013,944

[22] Filed: Jan. 27, 1998

Related U.S. Application Data

[62] Division of application No. 08/761,496, Dec. 6, 1996, Pat. No. 5,760,408.

[30] Foreign Application Priority Data

Dec. 8, 1995 [JP] Japan .................................. P7-320557

[51] Int. Cl.[7] .......................................................... B41J 2/47
[52] U.S. Cl. ........................ 347/255; 347/224; 250/492.2; 250/492.22; 250/504 R; 359/328; 372/22
[58] Field of Search ..................................... 347/224, 251, 347/256, 258, 255; 250/492.2, 492.22, 504 R, 503.1; 359/328; 372/22, 10, 12

[56] References Cited

U.S. PATENT DOCUMENTS

| | | | |
|---|---|---|---|
| 5,206,515 | 4/1993 | Elliott et al. | 250/492.2 |
| 5,434,662 | 7/1995 | Rockwell et al. | 356/4.01 |
| 5,473,409 | 12/1995 | Takeda et al. | 355/53 |
| 5,488,229 | 1/1996 | Elliott et al. | 250/492.2 |
| 5,559,338 | 9/1996 | Elliott et al. | 250/492.1 |
| 5,621,744 | 4/1997 | Kikuchi et al. | 372/12 |
| 5,760,408 | 6/1998 | Kikuchi et al. | 250/492.2 |

OTHER PUBLICATIONS

William N. Partlo, et al., "Reducing coherence in a fifth–harmonic YAG source (213nm) for use in microlithography", Journal of Vacuum Science & Technology B, vol. 9, No. 6, Nov. 1991, New York, US, pp. 3126–3131, XP 000268530.

J. M. Hutchinson, et al., "213nm Lithography", Microelectronic Engineering, vol. 21, No. 1/4, Apr. 1993, Amsterdam, NL, pp. 15–18, XP 000361044.

*Primary Examiner*—N. Le
*Assistant Examiner*—Hai C. Pham
*Attorney, Agent, or Firm*—Hill & Simpson

[57] ABSTRACT

A semiconductor light exposure device reducing coherency of laser light to an appropriate value by a simplified structure without producing speckles. The semiconductor light exposure device includes an ultraviolet light generating device, a uniform illumination device having the operation of inducing an optical path length difference and a projection device for projecting the laser light from the uniform illumination device. The ultraviolet light generating device includes an Nd:YAG Q-switch laser unit with a wavelength of 1064 nm, oscillated with a longitudinal single mode, a phase modulation unit or phase-modulating the fundamental laser light outgoing from the Nd:YAG Q-switch laser unit with voltage signals having plural frequency components, and a wavelength conversion unit for converting the wavelength of the fundamental laser light phase-modulated by the phase modulation unit into an ultraviolet laser light with a wavelength of 213 nm as a fifth harmonics.

53 Claims, 5 Drawing Sheets

SEMICONDUCTOR EXPOSURE DEVICE

This application is a division of application Ser. No. 08/761,496, filed Dec. 6, 1996, now issued as U.S. Pat. No. 5,760,408 on Jun. 2, 1998. Priority is claimed to application Ser. No. 08/761,496 and Japanese application P7-320557, filed Dec. 8, 1995.

BACKGROUND OF THE INVENTION

Field of the Invention

This invention relates to a semiconductor light exposure device applied in a stepper used in microprocessing of a semiconductor device, a projection exposure device used in this semiconductor light exposure device and a method for producing a circuit pattern in which the projection light exposure device is applied.

Up to now, researches have been conducted towards a shorter wavelength of a light source of a light exposure device used in microlithographic processing of a semiconductor device.

It should be noted that the fifth harmonics, that is a laser beam of a wavelength of 213 nm of the neodymium:yttrium aluminum garnet (Nd:YAG) laser generating a laser beam of the wavelength of 213 nm, has a high energy peak strength and is small-sized and inexpensive, so that it is highly promising as a laser light source of the next-generation light exposure device. In addition, it is of a narrow spectral width and hence is less susceptible to chromatic aberration.

However, the ultraviolet laser beam, obtained on wavelength conversion of the laser beam generated on oscillation by the Nd:YAG laser, is high in monochromaticity and hence narrow in spectral width, so that it exhibits high coherency. It is noted that coherency is an index specifying over which distance and time light beams are propagated and interfere with one another while maintaining the phase relationship.

If the coherency is high, the laser light interferes with stray light having difference propagation distances, such as scattered light, thus frequently producing the noise due to interference patterns caused by interference of light beams having mutually irregular phase relationship, or the so-called speckles (speckle noise). These speckles are particularly responsible for deterioration in performance in a device for which an illumination system of high uniformity is required, and hence is felt to be obstructive to application of the laser light source to the semiconductor light exposure device.

First, the relationship between the spectrum of laser light and coherency is explained.

Coherency of laser light is represented by a value termed visibility V. This visibility is the contrast of interference fringes formed by dividing laser light into two light beams, delaying one of these light beams so that the proceeding time of the two light beams differs by time $\tau$ ($\tau=L/C$ from each other, where L is the light path length difference and C is the velocity of light, and then by synthesizing the light beams. The visibility V is represented by the following equation (1):

$$V(\tau) = (I_{max} - I_{min})/(I_{max} + I_{min}) \quad (1)$$

where $I_{max}$ and $I_{min}$ denote the maximum and minimum values of the strength of the interference fringes, respectively. A light source with V=1 is maximum in coherence and is said to be a fully coherent light source. A light source with V=0 is minimum in coherence and is said to be a fully incoherent light source. In this case, no interference fringes are formed. The distance of coherence or the coherent length $L_C$ denotes the optical path difference of two light beams having sufficiently low visibility V and which can scarcely form interference fringes. The coherent length $L_C$ is defined by the following equation (2):

$$V(\tau_c) = 0, \quad L_C = \tau_c C \quad (2)$$

$$V(\tau) = <(t)E(t)+\tau)> \quad (3)$$

On the other hand, visibility ($\tau$) coincides with the autocorrelation function of the electrical field E(t) of the laser light, as shown by the equation (3).

From the theorem of Wiener-Khintchine, the autocorrelation function coincides with the Fourier transform of the power spectrum S(f) of the laser light, so that the visibility and the power spectrum are related with each other by the following equation (4):

$$V(\tau) \propto \int_{-\infty}^{\infty} S(f) \mathrm{Exp}(-i2\pi f \tau) df \quad (4)$$

It is assumed that the power spectrum S(f) depicts a Lorenz type curve and that the power spectrum is represented by the following equation (5):

$$S(f) \propto \left[1 + \left(\frac{2(f - f_0)}{\Delta f}\right)^2\right]^{-1} \quad (5)$$

where $f_0$ and $\Delta f$ denote the center frequency and the full width of the half value, respectively.

At this time, the visibility V is decreased exponentially as indicated by the following equation (6):

$$V(\tau) \approx \exp(-\pi \Delta f \tau) \quad (6)$$

The distance for which visibility V becomes sufficiently small is termed coherent length $L_C$ and is defined by the following equation (7):

$$L_C = \frac{2C}{\pi \Delta f} \quad (7)$$

FIG. 1A shows, as an example, a Lorenz type curve in which the power spectrum S(f) has the half value full width $\Delta f=4$ G(Hz). FIG. 1B shows the relationship between the optical path length difference L (mm) and visibility V in this case. In FIG. 1B, the abscissa represents the optical path length difference L between the two light beams which is defined by L=$\tau$C. The coherent length $L_C$ is on the order of 75 mm.

From the equation (7), coherence and monochromaticity of the laser light are in the relation of trade-off to each other in such a manner that a light source having high monochromaticity, that is narrow spectral width, is high in coherency and susceptible to speckles, whereas a light source having low monochromaticity is low in coherency but large in spectral width, such that the chromatic aberration tends to pose a problem particularly in an ultraviolet light source.

Thus, for applying the laser to, for example, an ultraviolet light exposure device, it is crucial to control the spectral width of laser light to an appropriate value so that no problem will be raised in chromatic aberration nor in speckles.

Various methods have hitherto been proposed for lowering monochromaticity and coherence of laser light.

In a semiconductor light exposure device, attempts have been made towards using KrF excimer laser or an ArF excimer laser, inherently larger in spectral line width and lower in coherency, as its light source.

However, the excimer laser has difficulties that highly toxic gases need to be used, while maintenance costs are high and a larger mounting space is required.

There are also presented difficulties that, because of the excessive spectral line width of laser light, chromatic aberration tends to be produced, such that it becomes necessary to reduce the band of the spectrum of oscillation for preventing the chromatic aberration from occurring. If the spectrum of oscillation is reduced in width, coherency is increased, such that coherency needs to be again lowered.

There is also known a method of employing a solid laser oscillated in multiple modes and to generate ultraviolet light by waveform conversion.

However, in this case, the number of modes or the mode spacing is determined by the structure of laser itself, that is by, for example, physical properties of the laser material. Thus it is difficult to realize the desired coherent length or spectral width in meeting with a particular device to which the light exposure device is applied.

Thus, with the conventional technique, it has been difficult to lower coherency of the semiconductor light exposure device without producing inconveniences.

SUMMARY OF THE INVENTION

It is therefore an object of the present invention to provide a semiconductor light exposure device whereby coherency of laser light can be lowered to an appropriate value by a simplified structure without producing speckles.

It is another object of the present invention to provide a projection light exposure device applicable to the method for the above semiconductor light exposure device and a method for producing a circuit pattern employing this projection light exposure device.

The present invention provides a semiconductor light exposure device including an ultraviolet laser light generating device, a uniform illumination device having the function of producing the optical path length difference and a projection device for projecting a pre-set image on a substrate using the laser light from the uniform illumination device. The ultraviolet laser light generating device includes a Q-switch laser light source for oscillation with a longitudinal single mode, phase modulation device for phase-modulating the fundamental laser light outgoing from the laser light source with a voltage signal composed of plural frequency components and wavelength converting device for converting the wavelength of the fundamental laser light phase-modulated by the phase modulation device into the wavelength of the ultraviolet light.

With the above-described semiconductor light exposure device, the fundamental laser light outgoing from, for example, a Q-switch laser light source, is phase-modulated by phase modulation device with plural frequency components for widening the spectral width. The phase-modulated laser light is wavelength-converted by wavelength conversion device by exploiting non-linear optical effects for further widening the spectral width. The uniform illumination device induces an optical path length difference in the wavelength-converted laser light and the projection device exposes the laser light at a desired position. By the combination of the pre-wavelength-conversion phase modulation and wavelength conversion, the wavelength-converted laser light can be easily widened in spectral width simply by impressing a lower electrical voltage across phase modulation device. The uniform illumination device further reduces speckles.

The present invention also provides a projection light exposure device in which fundamental laser light outgoing from a pulsed laser light source for oscillation with a longitudinal single mode is caused to be incident on wavelength conversion device for generating ultraviolet laser light having a center wavelength equal to 1/n of the wavelength of the fundamental laser light, and in which the ultraviolet laser light thus generated is illuminated on a mask for transcribing a pattern of the mask via a projection optical system on a photosensitive substrate. The projection light exposure device includes interference reducing device provided between the wavelength conversion device and the mask for reducing visibility of the interference noise generated on the photosensitive substrate responsive to the coherency of the ultraviolet laser light illuminating the mask, and phase modulation device for phase-modulating the fundamental laser light incident on the wavelength conversion device responsive to electrical signals containing plural frequency components for controlling the coherent length of the ultraviolet laser light. The projection light exposure device further includes a driving signal generating circuit for setting the plural frequency components contained in the electrical signal so that the coherent length of the ultraviolet laser light outgoing from the wavelength conversion device will be set between the minimum coherent length corresponding to the wavelength width producing the maximum chromatic aberration of the projection optical system allowed at the time of transcription of the pattern and the maximum coherent length capable of reducing the visibility of the interference noise by the interference reducing device to within a pre-set allowable range, and for supplying the frequency components thus set to the phase modulation device.

The present invention also provides a method for producing a circuit pattern in which fundamental laser light outgoing from a pulsed laser light source for oscillation with a longitudinal single mode is caused to be incident on wavelength conversion device for generating ultraviolet laser light having a center wavelength equal to 1/n of the wavelength of the fundamental laser light, wherein n is a natural number not less than 2, and in which the ultraviolet laser light thus generated is illuminated on a mask for transcribing a pattern of the mask via a projection optical system on a photosensitive substrate. The method includes the steps of phase-modulating the fundamental laser light by electro-optical phase modulation device so that, with $\Delta\lambda$ being a wavelength width of the ultraviolet laser light associated with the amount of chromatic aberration allowed by the projection optical system, the effective spectral width of the fundamental laser light incident on the wavelength conversion device will be approximately equal to $n \cdot \Delta\lambda$, and a step of setting frequency components of a signal driving the phase modulation device so that, if a set of lenses making up an projection optical system of the light projection device is formed of a single sort of the vitreous material, the coherent length corresponding to the wavelength width $\Delta\lambda$ of the ultraviolet laser light will be approximately equal to 80 mm or more, and of setting the frequency components of the signal driving the phase modulation device so that, if the projection optical system is formed by an achromatic projection lens formed of plural sorts of vitreous materials, or by the combination of a transmitting optical lens and a reflective optical element, the coherent length corresponding to the wavelength width $\Delta\lambda$ of the ultraviolet laser light will be approximately equal to 80 mm or less.

DESCRIPTION OF THE PREFERRED EMBODIMENTS

Before proceeding to the detailed description of the semiconductor light exposure device, the principle of electro-optical phase modulation and changes in the power spectrum by phase modulation based on this principle will be explained.

First, if a signal voltage of a periodic function $\phi(t)$ is impressed across an electro-optical modulation device constructed in accordance with the principle of the electro-optical phase modulation, an electrical field of the laser light undergoes phase modulation as indicated by the following equation (8):

$$E(t) = E_0(t) \exp[i 2\pi f t + i\phi(t)] \quad (8)$$

$$\phi(t) = m \sin 2\pi f_m t \quad (9)$$

where $\phi(t)$ is a phase modulation function proportionate to the voltage applied across the modulation device. In particular, if $\phi(t)$ is a sine wave having an amplitude m and a frequency $f_m$, as indicated by the equation (9):
the electrical field $E(t)$ can be expanded, using Bessel functions $J_k(m)$, as shown by the following equation (10):

$$E(t) = \sum_{k=-\infty}^{\infty} J_k(m) \exp[i 2\pi (f_0 + k f_m) t] \quad (10)$$

where $f_0$ is the laser frequency.

Figure 2A:
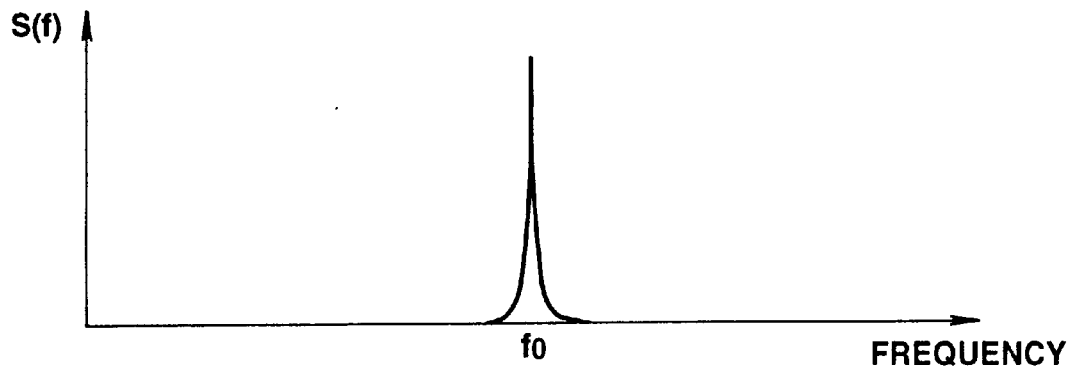
FIGS. 2A, 2B and 2C are graphs for illustrating the power spectrum phase-modulated with plural frequencies by a phase modulation device of a laser light producing device constituting a semiconductor light exposure device embodying the present invention.
Figure 2B:
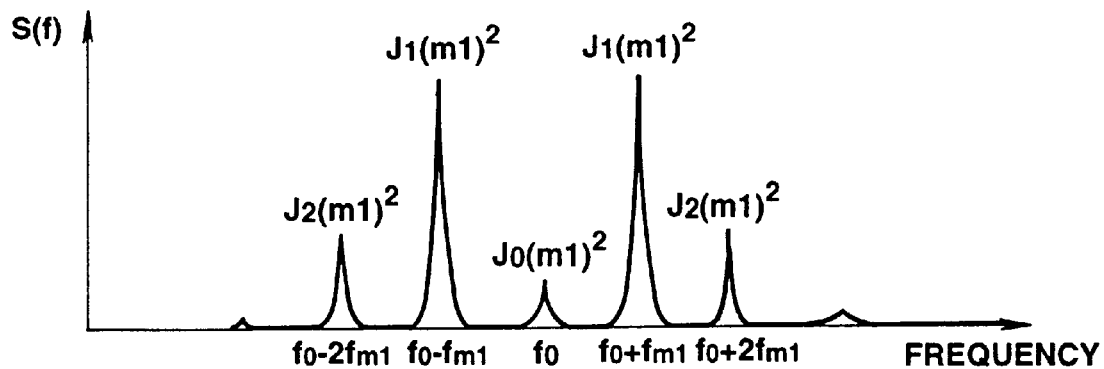

In this case, the power spectrum $S(f)$ may be represented by the sum total of the spectrum of the strength $J_k^2(m)$ and the frequency $(f_0 + k f_m)$, k being an integer, as shown in FIG. 2B.

In case of phase modulation at plural frequencies, phase modulation at each frequency acts additively and multiplicatively in frequency and strength, respectively, as indicated by the following equation (11):

$$\varphi(t) = \sum_j m_j \sin 2\pi f_{mj} t \quad (11)$$

Figure 2C:
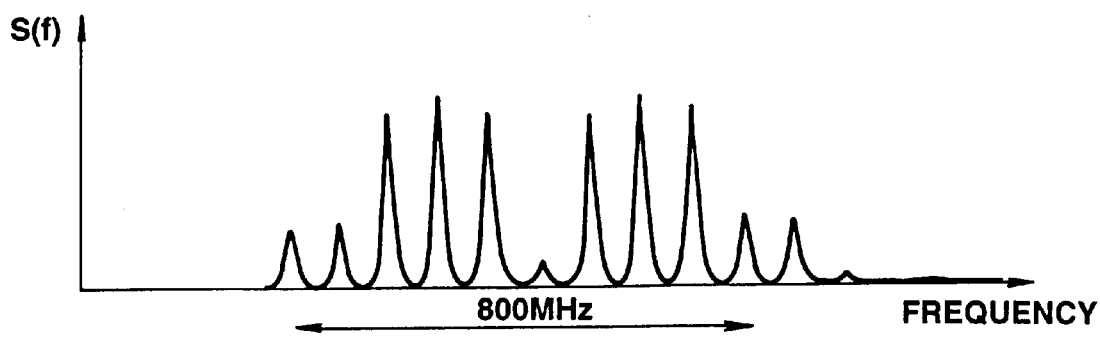

That is, the spectrum of a strength $J_k(m_1)^2$ and a frequency $(f_0 + k f_{m1})$, generated by phase modulation at an amplitude $m_1$ and a frequency $f_{m1}$, where k is an integer, is split by phase modulation at another frequency $f_{m2}$ into a spectrum with a strengths $J_k(m_1)^2 J_l(m_2)^2$ and a frequency $(f_0 + k f_{m1} + l f_{m2})$, where k and l are integers, as indicated in FIG. 2C.

It is seen from FIGS. 2A, 2B and 2C that phase modulation at plural frequencies lead to splitting into a larger number of spectral components. Moreover, if the least common multiple of the two frequencies is sufficiently large, the number of spectral components is approximately $m_1 m_2$.

In the process of the above phase modulation, it is not the spectral line width of the laser but the entire width of the spectrum that is widened as a result of splitting into a larger number of spectral components. The width of the envelope of the set of the spectral components is herein defined as being an entire width of the spectrum. The coherent length becomes shorter by the widening of the entire width of the spectrum.

Based on the foregoing, a specified embodiment of the semiconductor light exposure device according to the present invention will be explained by referring to the drawings and illustrative numerical values.

Figure 3:
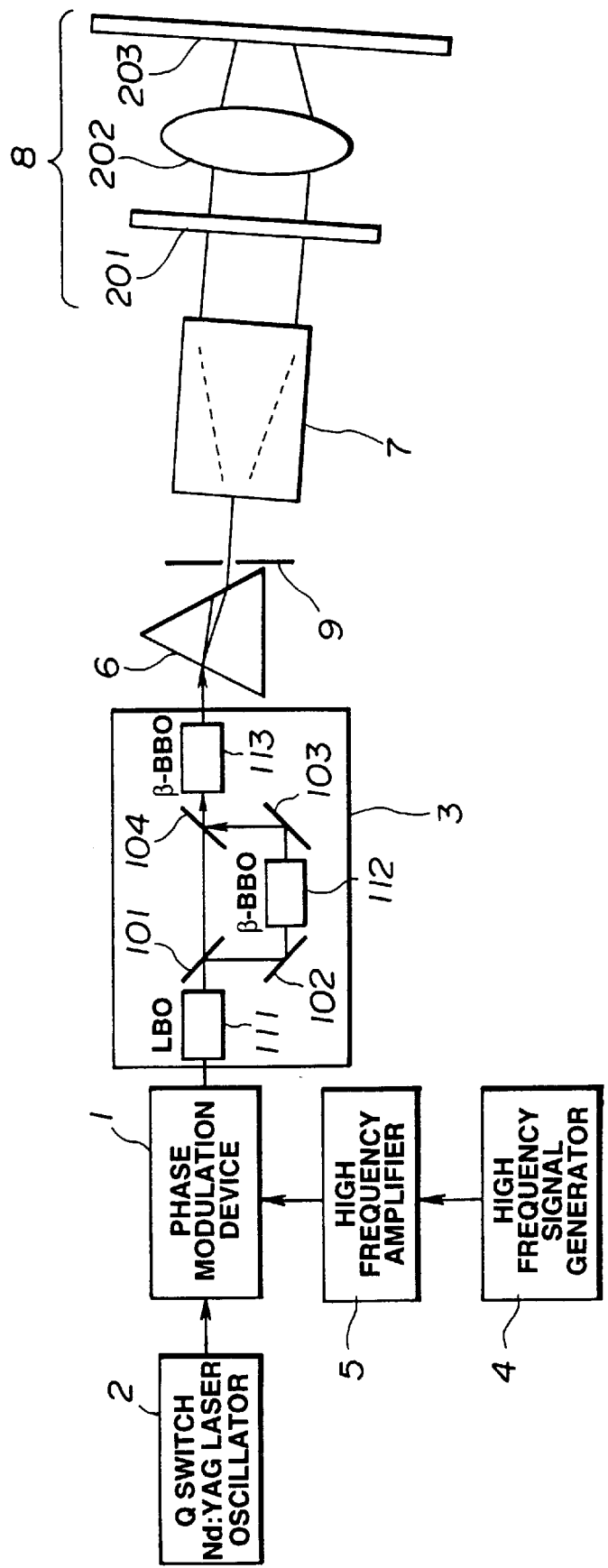
FIG. 3 is a block diagram showing an example of an illustrative structure of the light exposure device.

Referring to FIG. 3, the semiconductor light exposure device has, as an example of a pulse laser light source oscillating at a single longitudinal mode, a neodymium:yttrium aluminum garnet (Nd:YAG) for oscillation with a longitudinal single mode by the Q-switch mode at a wavelength of 1064 nm by a technique such as injection, and a phase modulation device 1 for modulating laser light from the Nd:YAG Q-switch laser device 2. The semiconductor light exposure device also includes a wavelength conversion device 3 formed of lithium borate LiB$_3$O$_5$ (LBO) or β-barium borate β-BaN$_2$O$_4$ (β-BBO) and adapted for converting the laser light with the center wavelength of 1064 nm, phase-modulated by the phase modulation device 1, into the ultraviolet laser light with the center wavelength of 213 nm representing 5-tuple frequency. The units from the phase modulation device 1 to the wavelength conversion device 3 make up an ultraviolet laser light generating device. The semiconductor light exposure device also includes a uniform illuminating device 7 for producing an optical path difference and a projection device 8 for projecting a pre-set pattern on a substrate using the laser light from the uniform illuminating device 7.

The semiconductor light exposure device additionally includes a high frequency signal generator 4 for generating the high frequency outputted to the phase modulation device 1 and a the high frequency amplifier 5 for amplifying the high frequency generated by the high frequency signal generator 4.

The projection light exposure device according to the present invention is such a device in which fundamental laser light outgoing from a Q-switch Nd:YAG laser oscillating device 2 as a pulsed laser light source for oscillation with a longitudinal single mode is caused to be incident on wavelength conversion device 3 for generating ultraviolet laser light having a center wavelength equal to 1/n of the wavelength of the fundamental laser light, wherein n is a natural number not less than 2, and in which the ultraviolet laser light thus generated is illuminated on a reticle 201 as a mask for transcribing a pattern of the mask via a projection optical system on a semiconductor substrate 203 as a photosensitive substrate. The projection light exposure device includes a uniform illumination device 7 as interference reducing device provided between the wavelength conversion device and the mask for reducing visibility of the interference noise generated on the photosensitive substrate responsive to the coherency of the ultraviolet laser light illuminating the mask, and phase modulation device 1 for phase-modulating the fundamental laser light incident on the wavelength conversion device responsive to electrical signals containing plural frequency components for controlling the coherent length of the ultraviolet laser light. The projection light exposure device further includes a high frequency signal generator 4 as a driving signal generating circuit for setting the plural frequency components contained in the electrical signal so that the coherent length of the ultraviolet laser light outgoing from the wavelength conversion device will be set between the minimum coherent length L1 corresponding to the wavelength width producing the maximum chromatic aberration of the projection optical system allowed at the time of transcription of the pattern and the maximum coherent length L2 capable of reducing the visibility of the interference noise by the interference reducing device to within a pre-set allowable range, and for supplying the frequency components thus set to the phase modulation device.

The laser light with a wavelength of 1064 nm, radiated from the Nd:YAG Q-switch laser device 2, is incident on the phase modulation device 1. This laser light from the Nd:YAG Q-switch laser device 2 is referred to hereinafter as the fundamental laser light. The voltage signals from the high frequency amplifier 4, having plural frequency components, are sent to the high frequency amplifier 5 for amplification. The amplified signal is applied to the phase modulation device 1.

In the phase modulation device 1, the fundamental laser light is phase-modulated depending on the voltage signal amplified by the high frequency amplifier 5 as will be explained subsequently. By this phase modulation, the entire spectral width of the fundamental laser light with the wavelength of 1064 nm is widened to, for example, $\Delta f_W$. The laser light, thus widened in its entire spectral width by the phase modulation, is sent to the wavelength conversion device 3.

The wavelength conversion device 3 includes a plurality of nonlinear optical crystals, as shown for example in FIG. 3. The laser light radiated from the phase modulation device 1 is transmitted through an LBO 111 as a non-linear optical crystal. At this time, laser light with a wavelength of 532 nm is generated as second harmonics. The laser light radiated from the LBO 111 includes light with a wavelength of 1064 nm and light with a wavelength of 532 nm. The laser light radiated from the LBO 111 falls on a color separation mirror 101 whereby the laser light with the wavelength of 1064 nm is transmitted and the laser light with the wavelength of 532 nm is reflected and has its optical axis bent 90°.

The laser light having the wavelength of 532 nm is further reflected by a total reflection mirror 102 and transmitted through a β-BBO 112 as a non-linear optical crystal to generate laser light with a wavelength of 266 nm as fourth harmonics. The laser light with the wavelength of 266 nm is reflected by the total reflection mirror 103 and the color separation mirror 104 and thence routed to a β-BBO 113.

The laser light with the wavelength of 1064 nm, transmitted through the color separation mirror 113, is transmitted through the color separation mirror 104 and thence routed to the β-BBO 113.

In the β-BBO 113, the laser light with the wavelength of 1064 nm and the laser light with the wavelength of 532 nm are mixed by additive frequency mixing, as later explained, for generating laser light with a wavelength of 213 nm as fifth harmonics of the fundamental laser light. This laser light with a wavelength of 213 nm is radiated from the wavelength conversion device 3. At this time, the spectral width $\Delta f_{5W}$ of the ultraviolet laser light after wavelength conversion is widened to five times as large as the spectral width prior to conversion $\Delta f_{5W}=5\Delta f_W$). The outgoing laser light includes, in addition to the laser light with the wavelength of 213 nm, light of various wavelength components, such as the components with the wavelength of 1064 nm or the second harmonics thereof, that is the components with the wavelength of 532 nm.

The additive frequency mixing is now explained.

First, when the laser light enters a non-linear optical crystal, non-linear polarization, not proportionate to the magnitude of the electrical field of the laser light applied from outside, is produced. If, in the presence of the non-linear polarization, the second-order susceptibility is not zero, for example, two light rays, that is the light with a frequency of $f_a$ and the light with a frequency of $f_b$, are incident simultaneously, non-linear polarization with a frequency of $f_c=f_a+f_b$ is induced in the crystal. This polarization results in emission of light with the frequency $f_c$. This represents the principle of additive frequency mixing. Specifically, with the incident laser light with a wavelength of $\lambda_a$ and the incident laser light with a wavelength of $\lambda_b$, the wavelength $\lambda_c$ for the additive frequency is related with the wavelengths $\lambda_a$ and $\lambda_b$ by the relationship $1/\lambda_c=1/\lambda_a+1/\lambda_b$. The non-linear optical crystal for additive frequency mixing is processed for propagating the laser light in a direction corresponding to the maximum efficiency of generation of the additive frequency.

A prism 6 separates laser light radiated by the wavelength conversion device 3 into respective wavelength components and sends only the laser light with the wavelength of 213 nm via a slit 9 to the uniform illumination device 7.

The uniform illumination device 7 has the operation of separating the incident laser light with the center frequency of 213 nm, producing the light path difference and again combining the separated components. The illuminating light, thus processed, is a spatially uniform light free from speckles. The illuminating light is radiated to the projection device 8.

The projection device 8 is made up of the reticle 201, a projection lens 202 and the semiconductor wafer 203. The reticle 201 is a so-called photomask having a pattern for projection on the semiconductor wafer 203. The projection lens 202 is a lens for projecting the light transmitted through the reticle 201 on the semiconductor wafer 203 to a reduced size, as will be explained subsequently. The semiconductor wafer 203 has a resist coated thereon such that a pattern processed on the reticle 201 is transcribed on the photoresist by the photosensitizing operation of the resist.

In general, the coherent length is shortened by enlarging the spectral line width, as mentioned previously.

By phase modulating the fundamental laser light, and by enlarging the spectral width of the phase-modulated fundamental laser light to five times as large as the original spectral line width by processing in the wavelength conversion device 3, the produced ultraviolet laser light is widened sufficiently in spectral width, while being sufficiently shortened in coherent length.

The ultraviolet laser light, sufficiently shortened in coherent length, is split by the uniform illumination device 7 and an optical light path difference longer than the coherent length is afforded to the split laser light. The laser light then is again synthesized to form incoherent laser light entirely free of coherency and outputted so as to be incident on the projection device 8.

The coherent length, required of the semiconductor exposure device, is explained. The desirable coherent length is determined from the allowable range of the chromatic aberration and condition under which speckles can be removed.

In general, a light source having short coherent length is wide in spectral width and low in monochromaticity. In such case, chromatic aberration is liable to be produced. In particular, if a single sort of the glass material is used for forming the projection leans 202, achromatism of the lens, that is the operation of correcting the chromatic aberration, cannot be achieved. Thus, for realizing sufficient image-forming properties, a coherent length of not less than 80 mm is required, in consideration of the practical values of NA and multiplication factor of the lens.

On the other hand, if the projection lens 202 is constituted using plural sorts of vitreous materials, and chromatic aberration is to be eliminated, it becomes possible to set looser constraint on the spectral width. For example, if the projection lens with the NA value of not less than 0.6 is produced from a practical glass material, the coherent length of not less than 30 mm gives sufficient image-forming properties.

For eliminating the speckles, a shorter coherent length is desirable. For practical purposes, the coherent length of not larger than 180 mm is desirable. Should it be possible to fabricate the projection lens using plural sorts of vitreous materials, the coherent length of not less than 30 mm and not larger than 80 mm may be said to be desirable.

In general, the projection lens 202, as a projection optical system used in this sort of the projection light exposure device, has an extremely high resolution, while various distortions in the image plane thereof are also suppressed to a minimum. The resolution of the projection lens 202 is defined based on the numerical aperture NA on the side of the semiconductor wafer 203 and the center wavelength of the illuminating light used for light exposure, although the wavelength width is also an influencing factor. For example, if the projecting optical system with the numerical aperture NA of 0.65 is used under the illuminating light with the center wavelength of 213 nm, resolution on the order of 0.1 to 0.2 $\mu$m in terms of line width is estimated to be obtained even taking into account the difference as to whether the projection optical system is comprised only of a refractive optical element or the combination of a refractive optical system and a reflective optical system, or the difference as to whether the exposure system is the still exposure system or the scanning exposure system.

It is assumed that, for realizing these properties, a projection optical system is designed under such conditions that a practical light exposure field is maintained, axial chromatic aberration and multiplication chromatic aberration are suppressed to sufficiently small values and only quartz ($SiO_2$) having sufficient transmittance for the center wavelength of 213 nm is used as the vitreous material for the lens, the coherent length of the ultraviolet laser light illuminated on the reticle during projection light exposure has been computed to be approximately 126 mm. This is equivalent to the full half-value of the spectrum as the wavelength width of approximately 0.35 pm. On the other hand, if plural quartz lenses and several fluorite ($CaF_2$) lenses are used in combination and slightly corrected for chromatic aberration, the coherent length of the ultraviolet laser light has been computed to be approximately 45 mm. This is equivalent to the full half-value of the spectrum as the wavelength width of approximately 1.0 pm.

These illustrative numerical values are varied not only with NA of the projection optical system, but also with the light exposure field size, projection multiplication factor and with the amount of correction of chromatic aberration. Although an upper limit value is imposed in the projection optical system constituted by the lens element formed of the sole vitreous material, depending on the coherency reducing performance of the uniform illuminating device 7, the coherent length of the ultraviolet laser light of not less than approximately 80 mm is required. Although a limitation is imposed on the lower limit value in the projection optical system constituted by the lens element formed of a single glass material or by the combination of a refractive element and a reflective element, depending on the degree of correction of chromatic aberration, the coherent length of the ultraviolet laser light of not larger than approximately 80 mm is thought to be a reasonable value.

As for the projection light exposure device, now being put to practical utilization, it has been proposed to use an excimer laser light source generating laser light with the center wavelength of 248 nm and a wavelength width $\Delta\lambda_a$ (half value full width (FWHM) of 0.8 pm, on the supposition that the projection optical system, with the numerical aperture NA of 0.6, formed entirely of quartz as vitreous material for the lens, is employed. Based on such projection optical system and the wavelength conditions of the laser light, the wavelength width and the coherent length, required for the ultraviolet laser light with the wavelength of 213 nm, may be computed as follows:

First, for finding the variance value of the quartz glass depending on the wavelength, the equation for variance by I. M. Malitson is used. With n being the refractive index and $\lambda$ being the wavelength in nm, this equation is written as:

$$n^2 - 1 = \sum_{j=1}^{3} \frac{Aj \cdot \lambda^2}{\lambda^2 - \lambda j^2} \tag{12}$$

As illustrative examples, the values of $A_1=0.6961663$, $\lambda_1=0.0684043$, $A_2=0.4079462$, $\lambda_2=0.1162414$, $A_3=0.8974794$ and $\lambda_3=9.896161$ are used.

Differentiating the equation (12) with reference to wavelength, we obtain:

$$\frac{dn}{d\lambda} = \frac{1}{n} \sum_{j=1}^{3} \frac{-Aj \cdot \lambda \cdot \lambda j^2}{(\lambda^2 - \lambda j^2)^2} \tag{13}$$

If, in the above equation (13), the refractive index n for $\lambda_a=248$ nm is 1.50855, $dn/d\lambda_a=-0.56/1000$. On the other hand, if the refractive index n for $\lambda_b$ is 1.53518, $dn/d\lambda_b=-1.02/1000$.

Computing the wavelength width $\Delta\lambda_b$ (half value full width) of the laser light with the center wavelength of 213 nm, required when employing the projection optical system with NA of 0.65 formed exclusively of quartz glass, $\Delta\lambda_b=\Delta\lambda_a$ (0.6/0.65)(0.6/0.65) 213/248)(0.56/1.02)=$\Delta\lambda_a$ 0.4=0.32 pm. From the formula $(\Delta\lambda_b \cdot \Delta\lambda b)/\Delta\lambda_b$ defining the coherent length, this value corresponds to the coherent length of approximately 142 mm.

If the numerical aperture NA of the projection optical system is set to approximately 0.7 under similar conditions, the coherent length becomes approximately equal to 180 mm.

The power spectrum of the ultraviolet light realizing the above coherent length is now briefly explained.

When the laser light source of the present embodiment is used as a light source for the projection device 8, it is desirable that coherency be sufficiently eliminated with the optical path difference not less than the coherent length. On the other hand, since the visibility V (τ) and the power spectrum S(f) are related with each other by the Fourier transform, visibility is decreased exponentially if the power spectrum obeys the Lorenz distribution. For example, if the light source is of the Lorenz spectrum type with the spectral half value full width Δf=4 GHz, coherency can substantially be disregarded for a distance of the coherent length Lc approximately equal to 75 mm or larger. For satisfying the condition for the coherent length of 30<$L_C$<180 mm, it is required for the spectral half value full width to be such that 2<Δf<10 GHz.

Figure 1A:
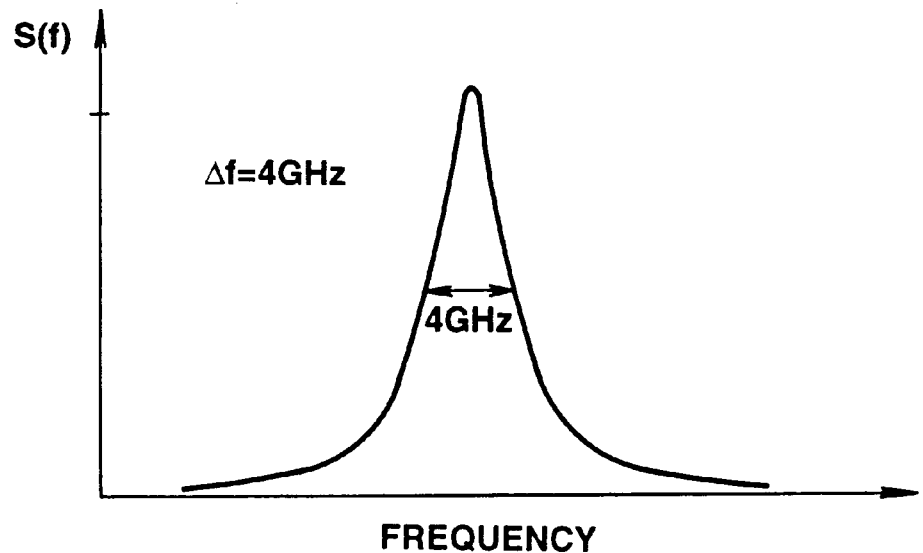
FIG. 1A is a graph showing a Lorenz type spectrum.
Figure 1B:
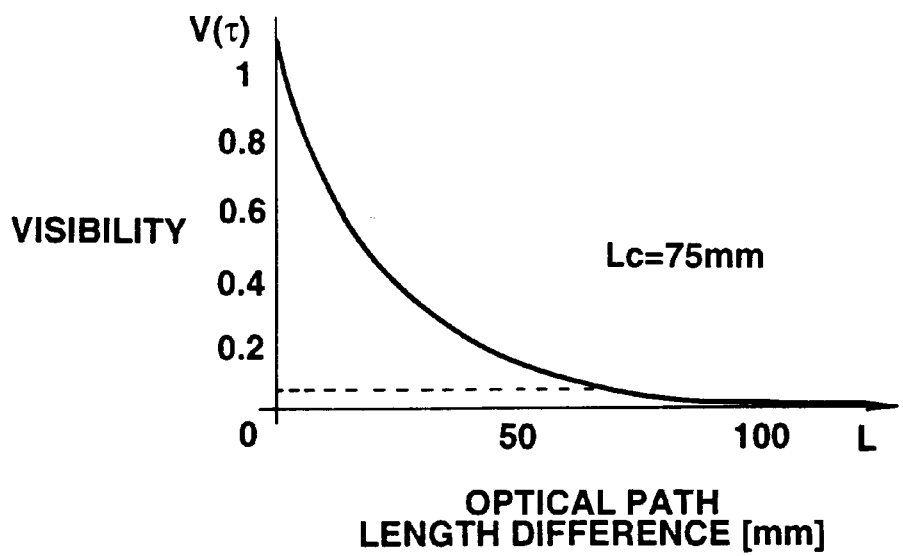
FIG. 1B is a graph showing the relationship between the optical path difference length and visibility represented by the Lorenz type spectrum.

Moreover, since phase modulation leads to separation of a spectrum into plural spectra, without the individual spectrum being widened in width, the complete Lorenz type spectrum, as shown in FIG. 1, cannot in effect be obtained by phase modulation.

Figure 4A:
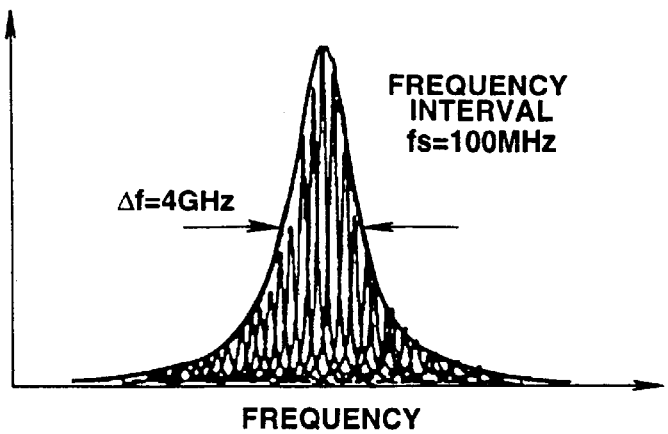
FIG. 4A is a graph showing the spectrum of a Lorenz type envelope realizable with the phase modulation device.

Therefore, the spectrum that can be realized and that is closest to an ideal spectrum is of such a shape in which the spectral line width in its entirety forms an envelope of the Lorenz distribution type with the spectral line width of, for example, Δf=4 GHz. In FIG. 4A, the narrow band spectrum with the frequency interval $f_s$=100 MHZ and a width of 40 MHZ as a whole constitutes the Lorenz distribution type spectrum with Δf=4 GHz.

Figure 4B:
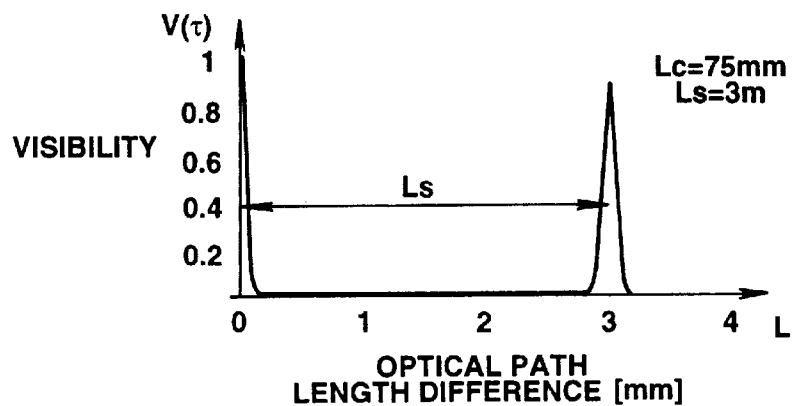
FIGS. 4B and 4C are graphs for illustrating the relationship between the optical path length difference and visibility represented by the spectrum of the envelope.
Figure 4C:
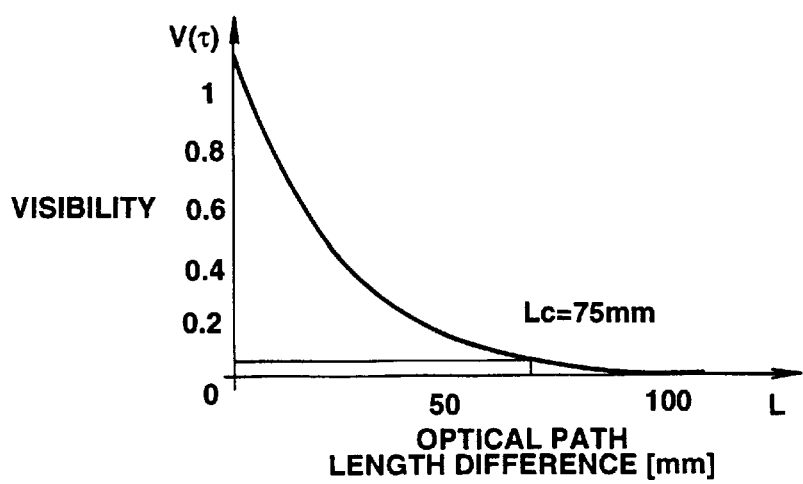

If the visibility of the spectrum shown in FIG. 4A is computed as a function of the optical path difference, visibility V becomes sufficiently small for the coherent length $L_C$=75 mm as determined by $L_C$=C/Δf, where C is the velocity of light, as shown in FIGS. 4B and 4C, such that it can be substantially disregarded, that is coherency is lost, for a distance of not less than 75 mm. However, this coherency re-appears significantly at distances equal to integer number of times of a distance $L_s$ determined by the frequency interval of the spectral components, that is $L_s$=C/$f_s$, for example, at $L_s$=3 mm, 6 mm, . . . for $f_s$=100 MHZ. In general, re-appearance of coherency is felt to be non-meritorious. It is now shown that, in the present illustrative embodiment, practically no problem is raised.

In the present illustrative embodiment, a transform-limited Q-switch pulse laser is used as the Nd:YAG Q-switch laser device 2. After wavelength conversion to 213 nm, this Q-switch pulse laser has a pulse width on the order of 10 ns. By multiplying the pulse width with the velocity of light, the length $L_p$=3 m of a pulse is computed. With the phenomenon of interference of two light beams having an optical path length difference of $L_p$ or longer, coherency is not displayed since the interference is that between different pulses. In the present embodiment, if coherency re-appears with the optical path length differences of 3 m, 6 m, . . . , the laser light generated by oscillation is pulsed light and each pulse has a length on the order of 3 m, coherency disappears with the optical path length difference of 3 m or longer.

Thus, the coherent length $L_C$=75 mm can be realized by enlarging the spectral width up to 4 GHz by employing phase modulation. Moreover, the distance for which coherency re-appears can be increased sufficiently up to approximately 3 m by reducing the distance between spectral components. In addition, since the pulse width of the Q-switch laser light is approximately 10 ns, coherency disappears with the optical path length difference of 3 m or more. Thus, coherency at the coherent length $L_C$ not less than $L_C$ can be disregarded.

The method of generating spectral components densely distributed with the frequency interval $f_s$=100 MHZ over a wider frequency width of, for example, Δf=4 GHz, as shown in FIG. 4A, using phase modulation, is now explained.

In the present invention, the above-mentioned spectral components are generated by combining roughly two separate generating device. One of the device phase-modulates the fundamental laser light prior to wavelength conversion, while the other is to effect phase modulation using plural frequencies.

The effect of phase-modulating the fundamental laser light is first explained.

If only the ultraviolet light is directly phase-modulated, as described above, it is extremely difficult to generate spectral components over a wide range having a spectral line width of 4 Ghz, as shown in FIG. 4A.

If phase modulation is effected wit a phase modulation function φ(t) shown for example by the equation (9):

$$\phi(t) = m \sin 2\pi f_m t \qquad (9)$$

about 2 m spectral components are newly produced, with the phase-modulated spectral components being spread to a frequency width of approximately Δf=2m$f_m$. Therefore, if, for realizing Δf=2m$f_m$=4 GHz, phase modulation is done with, for example, $f_m$=200 MHZ, the modulation amplitude m=10 s required, such that significantly high voltage needs to be impressed across the phase modulation device. Moreover, electro-optical crystals that can transmit the ultraviolet light are limited, such that crystals having only low electro-optical effect, such as potassium dihydrogen-phospahte (KH$_2$PO$_4$), ammonium dihydrogenphosphate (NH$_4$H$_2$PO$_4$) or β-barium borate (β-BBO) can be used. Thus, for realizing modulation amplitude m=10, an electrical voltage with an amplitude of not lower than 5 kV needs to be applied in general across the phase modulation device, so that it is difficult to realize this modulation amplitude. If phase modulation is performed at a higher frequency, for example, a frequency $f_m$=1 GHz, m=2 or thereabouts suffices. However, phase modulation is difficult to realize because a high frequency and an electrical voltage of large amplitude are then required.

As discussed above, modulation of the ultraviolet light over a wide range of 4 GHz for enlarging the spectral line width by simply directly phase-modulating the ultraviolet light cannot be realized because then a high electrical voltage is required.

The present invention provides a solution to this problem by phase-modulating the fundamental laser light prior to wavelength conversion having a wavelength of 1064 nm. This gives rise to the following two effects:

First, by generating fifth harmonics by wavelength conversion of the fundamental laser light, the spectral width can be enlarged to a five-tuple spectral width. The reason is that phase modulation of the fundamental laser light with the amplitude m is equivalent to phase modulation at an amplitude 5 m with the fifth harmonics, as shown by the equation (14):

$$E_{5\omega}(t) = E_{\omega 0}(t)^5 \exp(i10\pi f_0 t + i5\, m \sin 2\pi f_m t) \qquad (14)$$

Second, crystals having high electro-optical constants, such as titanic acid potassium phosphate (KTiOPO$_4$:KTP), titanic acid potassium arsenate (KTiOAsO$_4$), titanic acid rubidium arsenate (RbTiOAsO$_4$), titanic acid cesium arsenate (CsTiOAsO$_4$), lithium niobate (LiNoO$_3$) or lithium tantalate (LiTaO$_3$), can be used as electro-optical crystals.

Heretofore, these crystals were not usable for modulating fifth harmonics because these crystals cannot transmit the ultraviolet light. For example, KTiOPO$_4$ exhibits an electro-optical modulation efficiency 20 times as high as that of β-BBO. Therefore, the electrical voltage to be impressed is not higher than one-twentieth of that when using the crystal of the same size.

By the above two effects, the spectral width of the fifth harmonics having the wavelength of 213 nm can be enlarged by phase modulation of the fundamental laser light of a wavelength of, for example, 1064 nm prior to wavelength modulation. For example, for enlarging the spectral width to 4 GHz with the fifth harmonics, it suffices to increase the width of the fundamental laser light to a spectral width of 800 MHZ. This can be realized by phase-modulating the fundamental laser light with the modulation frequency $f_m$=200 MHZ and the modulation index m of 2 or thereabouts. This modulation index can be realized by applying a voltage signal of the amplitude of approximately 50 V and the frequency of 200 MHZ across the phase modulation device 1 in case the material of the phase modulation device 1 is KTP, the length through which the laser light travels in the crystal is 60 mm and the electrode-to-electrode distance is 1 mm.

The effect of phase modulation using plural frequencies is explained.

If phase modulation is performed with the single frequency, the strengths of the spectral components resulting from division are proportionate to the square of the Bessel function, so that limitation is imposed on the overall shape of the spectrum. Moreover, for increasing the distance $L_s$ of re-appearance of the coherency, it is necessary to reduce the frequency interval $f_s$ and to enlarge the spectrum, such that a larger value of the modulation index m is required. For example, if the spectral width is enlarged to Δf=800 MHZ, with $f_s$=100 MHZ, the modulation index m=4 or thereabouts, such that, with the phase modulation device employing the above-mentioned KTP, a higher voltage $V_{p-p}$=100 V is required. In addition, the spectral shape deviates substantially from that of the Lorenz type.

According to the present invention, the above problem is solved by performing phase modulation simultaneously using plural frequencies. Also it has become possible to reduce the frequency interval $f_s$, to enlarge the spectral width sufficiently and to realize the spectral shape close to that of the Lorenz type.

If phase modulation is performed simultaneously using plural frequencies, the spectral components generated by phase modulation at a given frequency component are further divided by another frequency component for generating more spectral lines. For example, if phase modulation is performed at $f_{m1}$=200 MHZ and $m_1$=0.2 or thereabouts, and phase modulation is performed again at $f_{m2}$=97 MHZ and $m_2$=1.4 or thereabouts, there is produced a spectrum shaped as shown in FIG. 2C and having a spectral interval $f_s$ of 97 MHZ and the overall spectral width Δf of 800 MHZ. The frequency interval $f_s$=97 MHZ is used for sufficiently increasing the least common multiple of two frequencies for preventing the generated spectral components from becoming overlapped and canceled with each other. Thus it is seen that an effect comparable to that when the spectral width is enlarged up to Δf=800 MHZ using only the frequency of 100 MHZ may be obtained with the halved phase modulation index. In addition, by impressing a signal of a large number of frequency components with appropriate amplitudes, the spectral shape closer to the that of the Lorenz type can be achieved.

For effectuating phase modulation using plural frequencies, a method of applying electrical voltages of different frequencies across plural phase modulation devices arranged in series, or a method of applying a signal having plural frequencies across a single phase modulation device, may be used.

If these two methods are combined, it becomes possible to generate spectral components densely over a wide spectral width at a low voltage by phase modulation of the fundamental laser light with plural frequencies. If the phase-modulated fundamental laser light is converted into fifth harmonics, the spectral width can be enlarged to a five-fold value. Moreover, by optimizing the phase modulation index of each frequency component, the envelope of the fifth harmonics can be approached to that of an optimum Lorenz type. By generating such spectrum, the coherent length can be reduced to approximately 765 mm.

Figure 5:
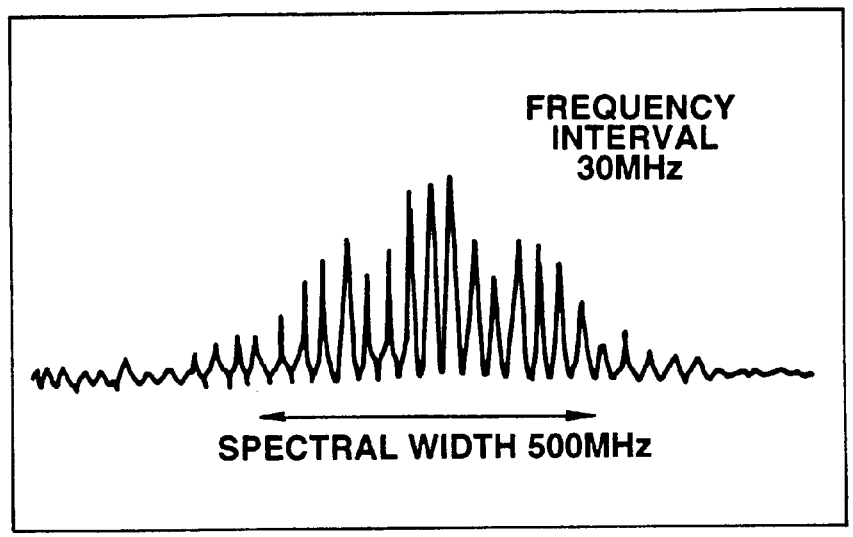
FIG. 5 illustrates an example of an envelope obtained on phase modulation by the phase modulation device.

FIG. 5 shows an example in which the spectrum close to that of the Lorenz type is generated by applying plural frequencies. Although the coherent length and the spectral width in the above example are 75 mm and 4 GHz, respectively, the coherent length can be adjusted to 30 to 180 mm by utilizing appropriate values of the modulation index and the voltage.

The materials of the phase modulation device may be any of electro-optical crystals capable of transmitting the near infra-red light, as explained previously.

As for KTP, taken as an example, a threshold value of laser damage by the Q-switch pulse laser in KTP of 20 J/cm² per pulse is reported. On the other hand, the pulse strength of the Nd:YAG Q-switch laser oscillation device, used as a light source of the above-mentioned ultraviolet light exposure device, is on the order of 1 mJ. If the beam diameter is 0.3 mm, the power density is 1.4 J/cm², which is approximately ¹⁄₁₅ of the threshold value for laser damage, thus preventing laser damage from occurring.

If a clear aperture of the phase modulation device is 1 mm by 1 mm, no diffraction loss is produced. The phase modulation index m is represented by the following equation (15):

$$m = \frac{\pi r n^3}{\lambda} \cdot \frac{l}{d} \cdot V \qquad (15)$$

in terms of the electro-optical modulation constant r of KTP, refractive index n of KTP, wavelength used λ, electrode-to-electrode distance d, crystal length l and the impressed voltage V.

By substituting λ=1064 nm, r=35 pm/V, n=1.83 and d=1 mm, and by setting the crystal length l=60 mm, the phase modulation index m=2 may be realized by the impressed voltage V=50 V or thereabouts.

In addition, KTP has an advantage that it exhibits no delinquency and is chemically stable.

Figure 6:
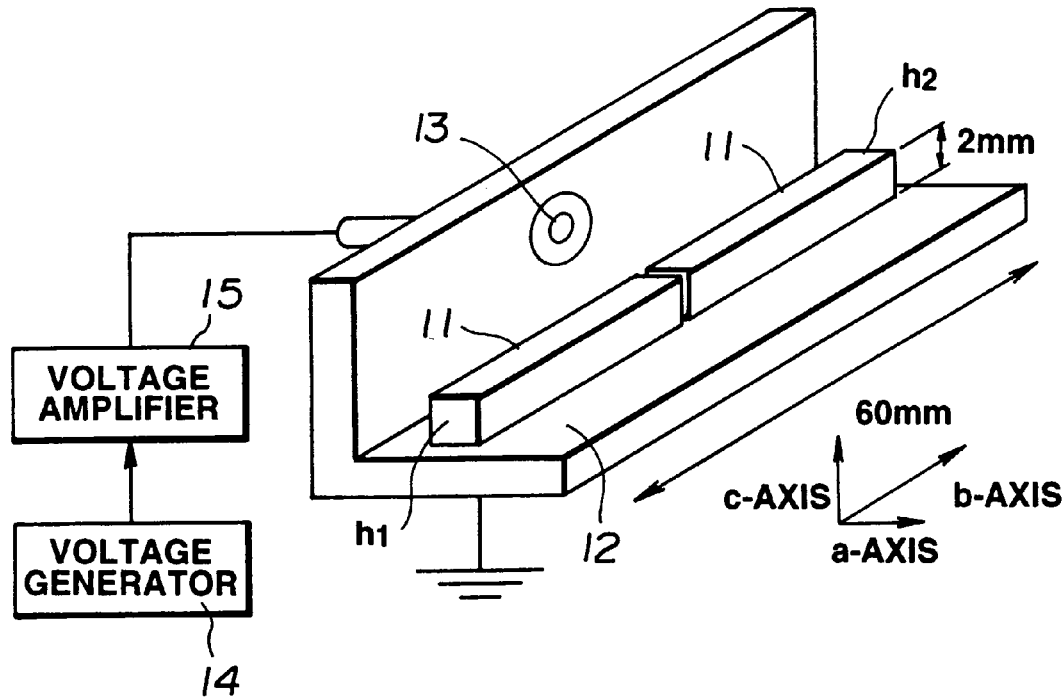
FIG. 6 illustrates a specified structure of the phase modulation device employing KTP as an electro-optical crystal.

FIG. 6 shows an illustrative structure of the phase modulation device formed of the above-sized KTP.

In FIG. 6, a pair of KTPs 11, as electro-optical crystal elements, are arranged at a per-set position on a mount 12. If an axis b is arrayed in the longitudinal direction of the KTP 11, an axis c is arranged normal to the axis b and to the mounting plane of the KTP 11, and an axis a is arrayed normal to both the axes b and c, a pair of surfaces of each KTP 11 run parallel to an a-c plane including the axes a and c.

To one of electrodes formed on a pair of surfaces parallel to an a-b plane formed by the axes a and b of each KTP 11, a voltage signal from a voltage amplifier 15 as later explained is applied via a connector 13, while the opposite side electrode is grounded. The voltage generator 14 generates the phase modulation frequency and outputs the generated voltage signal to a voltage amplifier 15. The voltage amplifier 15 amplifies and outputs the voltage signal generated by the voltage generator 14.

In the phase modulation device, shown in FIG. 6, a single crystal 60 mm in size in the longitudinal direction is not used as KTP. Instead, two crystals 30 mm in size in the longitudinal direction are arrayed in series with each other for ease in processing. The surfaces of the KTP normal to the longitudinal direction thereof are square-shaped with each side being 1 mm long.

In FIG. 6, the fundamental laser light is incident from a side $h_1$ which is one of the square-shaped sides and which is directed outwards. The incident fundamental laser light is phase-modulated at the phase modulation frequency outputted by the voltage modulator 14. The phase-modulated laser light is outputted to outside at the opposite side square-shaped surface $h_2$.

In the above-described illustrative embodiment, the coherent length of the highly coherent fifth harmonics of the Q-switch Nd:YAG laser can be reduced to approximately 30 to 180 mm desirable for the projection apparatus by phase modulation of the fundamental laser light and phase modulation at plural frequencies. The result is that the Q-switch Nd:YAG laser, which is more small-sized and less toxic, easier to handle and consumes less energy than the conventional excimer laser can be applied to an ultra-violet light exposure device. A phase modulation device employing a crystal of KTP or its derivative may be used.

FIG. 3 shows a semiconductor light exposure device employing an ultra-violet laser light generating device, made up of a Q-switch laser light source, phase modulation device and wavelength conversion device, as a light source radiating a laser beam employed in the uniform illumination device.

In the above-described ultraviolet laser light generating device, a Q-switch laser light source formed of Nd:YAG and designed for oscillation with a single mode is used as a fundamental light source. The fundamental laser light is modulated by the phase modulation device with plural frequency components and wavelength-converted into fifth harmonics by wavelength conversion device.

Therefore, the spectral width can be sufficiently enlarged and coherency can be sufficiently lowered despite the small amplitude of the sine wave impressed at the time of the phase modulation. Moreover, speckles can be eliminated by the combination of the ultraviolet laser light generating device and the uniform illumination device.

The speckles (interference noise) also differ in the degree of visibility depending on the structure of the uniform illumination device 7. As an optical system in which an illumination area on the reticle 201 employed for the ultraviolet laser light for light exposure is rectangular or slit-shaped and in which the uniformity of strength distribution in the illuminated area is less than a few percent, a second-order light source surface has hitherto been produced by a fly-eye lens integrator, in which a large number of second-order light sources (point light sources) are distributed within a plane.

In this case, there are occasions wherein light rays proceeding from point light sources among the numerous second-order point light sources lying close to each other within a pre-set distance interfere with each other depending on the coherent length of the ultraviolet laser light incident on the optical integrator. By this interference, first-order or second-order interference fringes associated with the arraying direction of the numerous second-order light sources formed by the optical integrator appear on the reticle 201 or on the semiconductor wafer 203. The visibility of the interference fringes depend on the coherent length of the ultraviolet laser light.

These interference fringes are periodic and hence are sometimes distinguished from speckles which represent inherent random interference phenomenon. Broadly, however, both represent the interference phenomenon and, in case of an extremely large coherent length of the laser light, both the random speckle pattern and the periodic coherent length occur with significant visibility. With lowering of the coherent length, the visibility of the random speckle pattern first falls to a level smaller than an allowable value so as to be reduced to zero. If the coherent length is lowered further, visibility of the periodic interference fringes also falls below the allowable value so as to be reduced to zero.

In actual light exposure devices, deterioration in the image quality is sometimes induced at the time of transcription of the circuit pattern of the reticle 201 to the semiconductor wafer 203 even if the contrast of the interference fringes is on the order of several percent. In such case, the incident angle of the ultraviolet laser light incident on the optical integrator is finely varied with pulse oscillation by, for example, an oscillation mirror for producing phase difference (optical path length difference) between numerous second-order light sources for displacing interference fringes on the reticle or the semiconductor wafer over a distance equal to an integer number of times of the one-half period in the pitch direction for additively uniforming the light exposure amount distribution on the semiconductor wafer.

Alternatively, the interference fringes produced on the semiconductor wafer employing the optical integrator may be diminished by high-speed rotation during the light exposure operation of a circular diffusion plate (lemon-skin or the like) provided ahead of the integrator for transmitting and scattering the ultraviolet laser light in a random direction. In this case, the light exposure amount distribution is averaged by additive integration of numerous interference fringes generated in a random direction every pulsed light. It is crucial with a light exposure device that sporadic illumination on the semiconductor wafer be ultimately uniformed, that is that the target light exposure amount be given at any point in a given shot area on the semiconductor wafer with a precision within ±1%. Therefore, if the dynamic interference reducing device by the oscillation mirror or the circular diffusion plate is provided in the uniform illuminating device 7, the coherent length of the ultraviolet laser light is determined in consideration also of the interference noise reducing performance of the dynamic interference producing device.

Of course, as the uniform illumination device 7, the above-mentioned dynamic interference reducing device may be used in combination with a static interference reducing device which splits the ultraviolet laser light beam from the wavelength conversion device 3 into plural light beams and re-combines the light beams into a single light beam after affording different optical path differences to the split light beams for reducing the coherency.

In this case, the exposure illumination system becomes complex in structure and the effective illuminating optical path is also prolonged, thus slightly increasing the loss in the light volume. However, there is obtained a significant merit that significant increase in the coherent length of the ultraviolet light from the waveform conversion device 3 of the order of, for example, 500 mm, can be coped with. The fact that such large coherent length value is allowed means that the effective frequency spectrum width of high-frequency signals for phase modulation produced by the high-frequency generator 4 (distribution width of plural frequencies) can be reduced thus simplifying the structure of the high-frequency signal generator 4.

Finally, the method for producing a circuit pattern using the above-described semiconductor light exposure device is explained.

The method for producing a circuit pattern is such a method in which fundamental laser light outgoing from a pulsed laser light source designed for oscillation with a longitudinal single mode is caused to be incident on wavelength conversion device for generating ultraviolet laser light having a center wavelength equal to 1/n of the wavelength of the fundamental laser light, wherein n is a natural number not less than 2, and in which the ultraviolet laser light thus generated is illuminated on a mask for transcribing a pattern of the mask via a projection optical system on a photosensitive substrate. The method includes the steps of phase-modulating the fundamental laser light by electro-optical phase modulation device so that, with $\Delta\lambda$ being a wavelength width of the ultraviolet laser light associated with the amount of chromatic aberration allowed by the projection optical system, the effective spectral width of the fundamental laser light incident on the wavelength conversion device will be approximately equal to $n \cdot \Delta\lambda$, and a step of setting frequency components of a signal driving the phase modulation device so that, if a set of lenses making up an projection optical system of the light projection device is formed of a single sort of the vitreous material, the coherent length corresponding to the wavelength width $\Delta\lambda$ of the ultraviolet laser light will be approximately equal to 80 mm or more, and of setting he frequency components of the signal driving the phase modulation device so that, if the projection optical system is formed by an achromatic projection lens formed of plural sorts of vitreous materials, or by the combination of a transmitting optical lens and a reflective optical element, the coherent length corresponding to the wavelength width $\Delta\lambda$ of the ultraviolet laser light will be approximately equal to 80 mm or less.

With the above-described structure of the semiconductor light exposure device, in which a simplified structure is annexed on the outer side of the light source of the ultraviolet laser light producing device, the laser light outgoing from the ultraviolet laser light generating device can be reduced in coherency for eliminating the speckles without the necessity of causing multi-mode oscillation of the light source or significantly modifying the structure of the ultraviolet light generating device.

By employing a near-infra-red laser light as the light source of the ultraviolet laser light generating device, and by phase-modulating the laser light by dedicated phase modulation device, the electro-optical crystals that can be used can be diversified as compared to the case in which the ultraviolet light is directly phase-modulated for enlarging the spectral width.

What is claimed is:

1. A light exposure method comprising the steps of:
   (a) phase-modulating a fundamental wavelength laser light, generated by a laser light source, simultaneously using a plurality of frequencies to provide a phase-modulated laser light; and
   (b) exposing a substrate with a predetermined pattern using the phase-modulated laser light.

2. The light exposure method according to claim 1, wherein phase modulator by said plurality of frequencies is effected by a signal having a plurality of frequency components.

3. The light exposure method according to claim 1, wherein phase modulation by said plurality of frequencies is effected serially by signals having different frequencies.

4. The light exposure method according to claim 1 further comprising, after step (a) and before step (b):
   (c) converting the wavelength of the phase-modulated fundamental wavelength laser light into a pre-set wavelength; and
   (d) separating the wavelength-converted laser light into respective wavelength components to extract only said pre-set wavelength.

5. The light exposure method according to claim 4 further comprising, after step (d) and before step (b):
   (e) effecting to the laser light an operation of decreasing visibility of the interference noise generated on the substrate in dependence upon a coherent length of the extracted laser light.

6. The light exposure method according to claim 5, wherein step (e) includes separating the extracted laser light to provide an optical path length difference and subsequently recombining the laser light.

7. The light exposure method according to claim 6, wherein said optical path length difference is longer than the coherent length of the laser light.

8. The light exposure method according to claim 5, wherein step (a) includes minutely changing an angle of incidence of the extracted laser light on an optical integrator along with pulsed oscillations of a pulsed laser light source.

9. The light exposure method according to claim 5, wherein step (e) includes transmitting and diffusing the extracted laser light in a random direction.

10. The light exposure method according to claim 4, wherein said laser light source includes a Nd:YAG laser oscillated by a Q-switching method, and wherein said wavelength conversion includes conversion of the wavelength of said laser light into fifth harmonics.

11. The light exposure method according to claim 4, wherein said pre-set wavelength includes a wavelength of ultra-violet light.

12. The light exposure method according to claim 1, wherein said laser light source includes a pulsed laser light source oscillated at a longitudinal single mode.

13. The light exposure method according to claim 1, wherein said pattern is formed on a mask, and the pattern is projected on said substrate via a projecting optical system.

14. The light exposure method according to claim 13, wherein said projecting optical system is composed of a sole vitreous material and wherein said laser light has a coherent length of 80 to 180 mm.

15. The light exposure method according to claim 13, wherein said projecting optical system is composed of a plurality of types of a vitreous material and wherein said laser light has a coherent length of 30 to 80 mm.

16. The light exposure method according to claim 1, wherein step (a) includes phase-modulating the fundamental wavelength laser light using an electro-optical crystal not permitting transmission of ultraviolet light therethrough, and step (b) includes converting the phase-modulated laser light into a wavelength of ultraviolet light then illuminating the pattern on the mask with the wavelength-converted laser light.

17. The light exposure method according to claim 16, wherein said electro-optical crystal includes at least one of potassium phosphate titanate ($KTiOP_4$:KTP), potassium arsenate titanate ($KTiOAsOP_4$:KTP), rubidium arsenate titanate ($RbTiOAsO_4$), cesium arsenate titanate ($CsTiOAsO_4$), lithium niobate ($LiNbO_3$) or lithium tantalate ($LiTaO_3$).

18. The light exposure method according to claim 1, wherein step (a) includes phase-modulating the fundamental wavelength laser light using an electro-optical crystal not permitting transmission of ultraviolet light therethrough, and step (b) includes converting the phase-modulated laser light into fifth harmonics and then illuminating the pattern formed on the mask with the fifth harmonics.

19. The light exposure method according to claim 18, wherein said electro-optical crystal includes at least one of potassium phosphate titanate ($KTiOP_4$:KTP), potassium arsenate titanate ($KTiOAsOP_4$:KTP), rubidium arsenate titanate ($RbTiOAsO_4$), cesium arsenate titanate ($CsTiOAsO_4$), lithium niobate ($LiNbO_3$) or lithium tantalate ($LiTaO_3$).

20. A method for fabricating a micro device comprising the steps of:
    phase-modulating a fundamental wavelength laser light, generated by a laser light source, simultaneously using a plurality of frequencies to provide a phase-modulated laser light; and
    illuminating a circuit pattern on a mask with the phase-modulated laser light to expose the circuit pattern on a substrate to transcribe the circuit pattern on the mask onto said substrate.

21. A method for manufacturing a light exposure apparatus that exposes a pattern formed on a mask onto a substrate with light, comprising the steps of:
    providing a laser light source that generates a fundamental wavelength laser light; and
    providing a phase modulation system between said laser light source and the mask, said phase modulation system phase-modulates the fundamental wavelength laser light, generated by a laser light source, simultaneously using a plurality of frequencies.

22. The method according to claim 21, wherein a signal having a plurality of frequency components is applied to said phase modulation system.

23. The method according to claim 21, wherein said phase modulation system includes a plurality of series-connected phase modulation devices; and wherein signals having respective different frequencies are applied to said phase modulation devices.

24. The method according to claim 21, comprising the step of providing a wavelength conversion device between said phase modulation system and the mask, said wavelength conversion device converting the wavelength of the phase-modulated fundamental wavelength laser light into a pre-set wavelength.

25. The method according to claim 24, comprising the step of providing an interference reducing device between the wavelength conversion device and the mask, said interference reducing device reducing visibility of interference noise generated on said substrate in dependence upon a coherent length of the laser light.

26. The method according to claim 21, comprising the step of providing a projecting optical system for projecting the pattern on the mask on said substrate between said mask and the substrate; and wherein said projecting optical system is formed of a sole vitreous material, said laser light having a coherent length of 80 to 180 mm.

27. The method according to claim 21, comprising the step of providing a projecting optical system for projecting the pattern on the mask on said substrate between said mask and the substrate; and wherein said projecting optical system is formed of plural sorts of a vitreous material, said laser light having a coherent length of 30 to 80 mm.

28. The method according to claim 21, wherein said phase-modulation system includes an electro-optical crystal not permitting transmission of ultraviolet light therethrough, which electro-optical crystal is arranged between the laser light source and the mask and which phase-modulates the fundamental wavelength laser light, and said method further comprising providing a wavelength conversion device arranged between the electro-optical crystal and the mask, the wavelength conversion device converting the laser light phase-modulated laser light into a wavelength of ultraviolet light.

29. The method of claim 28, wherein said electro-optical crystal includes at least one of potassium phosphate titanate ($KTiOPO_4$:KTP), potassium arsenate titanate ($KTiOAsO_4$), rubidium arsenate titanate ($RbTiOAsO_4$), cesium arsenate titanate ($CsTiOAsO_4$), lithium niobate ($LiNbO_3$) or lithium tantalate ($LiTaO_3$).

30. The method according to claim 21, wherein said phase-modulation system includes
    an electro-optical crystal not permitting transmission of ultraviolet light therethrough, which is arranged between the laser light source and the mask, and which phase-modulates the fundamental wavelength laser light, and said method further comprising providing a wavelength conversion device arranged between the electro-optical crystal and the mask, which wavelength conversion device converts the phase-modulated laser light into fifth harmonics.

31. The method according to claim 30, wherein said electro-optical crystal includes at least one of potassium phosphate titanate ($KTiOPO_4$:KTP), potassium arsenate titanate ($KTiOAsO_4$), rubidium arsenate titanate ($RbTiOAsO_4$), cesium arsenate titanate ($CsTiOAsO_4$), lithium niobate ($LiNbO_3$) or lithium tantalate ($LiTaO_3$).

32. A light exposure method comprising the steps of:
    phase-modulating a fundamental wave laser light generated by a laser light source; and
    wavelength-converting the phase-modulated laser light;
    said phase modulation being performed so that a coherent length of the laser light following the wavelength conversion will be not less than 30 mm.

33. The light exposure method according to claim 32, wherein said phase modulation is effected so that the coherent length of the laser light following the wavelength conversion will be not less than 30 mm and not larger than 180 mm.

34. The light exposure method according to claim 33, wherein the exposure method further includes
    transferring a predetermined pattern formed on a mask onto a substrate, via a projection optical system formed of plural sorts of vitreous material, using the laser light following said wavelength conversion.

35. The light exposure method according to claim 32, wherein said phase modulation is effected on the fundamental wavelength laser light using plural frequencies.

36. The light exposure method according to claim 32, wherein said phase modulation is effected using an electro-optical crystal not transmitting ultraviolet light and wherein
    in said wavelength conversion, the phase modulated laser light is converted to light of an ultraviolet wavelength or to fifth harmonics.

37. A method for manufacturing a micro device by transcribing a circuit pattern formed on a mask onto a substrate using the light exposure method according to claim 32.

38. A light exposure method comprising the steps of:
    phase modulating the fundamental wavelength laser light generated by a laser light source; and wavelength converting the phase modulated laser light;

wherein phase modulation is effected so that a coherent length of the laser light following wavelength conversion will be not larger than 180 mm.

39. The light exposure method according to claim 38, wherein said phase modulation is effected so that the coherent length of the laser light following wavelength conversion will be not less than 80 mm and not larger than 180 mm.

40. The light exposure method according to claim 39, wherein the light exposure method further includes transferring a predetermined pattern formed on a mask onto a substrate, via a projection optical system formed of a sole sort of a vitreous material, using the laser light following said wavelength conversion.

41. The light exposure method according to claim 38, wherein said phase modulation is effected on the fundamental wavelength laser light using plural frequencies.

42. The light exposure method according to claim 38, wherein said phase modulation is effected using an electro-optical crystal not transmitting ultraviolet light and wherein, in said wavelength conversion, the phase modulated laser light is converted to light of an ultraviolet wavelength or to fifth harmonics.

43. A method for manufacturing a micro device by transcribing a circuit pattern formed on a mask onto a substrate using a light exposure method, said method comprising the steps of:

phase modulating the fundamental wavelength laser light generated by a laser light source; and wavelength converting the phase modulated laser light;

wherein phase modulation is effected so that a coherent length of the laser light following wavelength conversion will be not larger than 180 mm.

44. A manufacturing method for manufacturing a light exposure device used for exposing a pattern on a mask onto a substrate, comprising the steps of:

providing a laser light source that generates a fundamental wavelength laser light;

providing a phase modulation system that effects phase modulation for the fundamental wavelength laser light generated from said laser light source between said laser light source and the mask;

providing a wavelength conversion system that converts the wavelength of the laser light phase modulated by the phase modulation system between the phase modulation system and the mask; and effecting phase modulation by said phase modulation system so that a coherent length of the laser light following wavelength conversion by said wavelength conversion system will be not less than 30 mm.

45. The manufacturing method according to claim 44, wherein said phase modulation system effects phase modulation so that the coherent length of the laser light following wavelength conversion will be not less than 30 mm and not larger than 80 mm.

46. The method according to claim 45, and wherein the manufacturing method further includes providing a projection optical system formed of plural sorts of a vitreous material between the mask and the substrate, said projection optical system being adapted to project said pattern on said substrate.

47. The method according to claim 44, wherein said phase modulation system effects phase modulation using plural frequencies.

48. The method according to claim 44, wherein said phase modulation system includes an electro-optical crystal not transmitting ultraviolet light therethrough and wherein in said wavelength conversion, the phase modulated laser light is converted to light of an ultraviolet wavelength or to fifth harmonics.

49. A method for manufacturing a light exposure device used for exposing a pattern on a mask onto a substrate, said method comprising the steps of:

providing a laser light source that generates a fundamental wavelength laser light;

providing a phase modulation system that effects phase modulation for the fundamental wavelength laser light generated from said laser light source between said laser light source and the mask;

providing a wavelength conversion system that converts the wavelength of the laser light phase modulated by the phase modulation system between the phase modulation system and the mask; and effecting phase modulation by said phase modulation system so that a coherent length of the laser light following wavelength conversion by said wavelength conversion system will be not larger than 180 mm.

50. The manufacturing method according to claim 49, wherein said phase modulation system effects phase modulation so that the coherent length of the laser light following wavelength conversion will be not less than 80 mm and not larger than 180 mm.

51. The manufacturing method according to claim 50, wherein the method further includes providing a projection optical system formed of a sole vitreous material between said mask and the substrate, said optical system being adapted to project said pattern on said mask onto said substrate.

52. The manufacturing method according to claim 49, wherein said phase modulation is effected by said phase modulation system on the fundamental wavelength laser light using plural frequencies.

53. The manufacturing method according to claim 49, wherein said phase modulation system contains an electro-optical crystal not transmitting ultraviolet light therethrough and wherein said phase modulation system converts the phase-converted laser light to the wavelength of an ultraviolet light or to fifth harmonics.

* * * * *